(12) United States Patent
Lin et al.

(10) Patent No.: US 11,744,045 B2
(45) Date of Patent: Aug. 29, 2023

(54) ELECTRONIC DEVICE COMPRISING A THERMALLY CONDUCTIVE CONNECTOR COMPRISING GRAPHITE

(71) Applicant: QUALCOMM Incorporated, San Diego, CA (US)

(72) Inventors: Hung-Wen Lin, Kaohsiung (TW); Sin-Shong Wang, Taipei (TW); Jen-Chun Chang, Linkou Dist (TW); Qiang Du, San Diego, CA (US); Jorge Luis Rosales, San Diego, CA (US); Ajit Kumar Vallabhaneni, Carlsbad, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/523,692

(22) Filed: Nov. 10, 2021

(65) Prior Publication Data

US 2023/0145773 A1 May 11, 2023

(51) Int. Cl.
*H05K 7/20* (2006.01)
*G06F 1/20* (2006.01)
*G06F 1/16* (2006.01)

(52) U.S. Cl.
CPC ......... *H05K 7/2039* (2013.01); *G06F 1/1681* (2013.01); *G06F 1/203* (2013.01); *G06F 2200/203* (2013.01)

(58) Field of Classification Search
CPC ..... H05K 7/2039; G06F 1/1681; G06F 1/203; G06F 2200/203
See application file for complete search history.

(56) References Cited

U.S. PATENT DOCUMENTS

| | | | | |
|---|---|---|---|---|
| 5,757,615 A | * | 5/1998 | Donahoe | G06F 1/203 361/679.48 |
| 6,075,696 A | * | 6/2000 | Progl | G06F 1/203 361/679.52 |
| 11,079,807 B1 | * | 8/2021 | Robinson | E05D 7/00 |
| 2005/0168941 A1 | | 8/2005 | Sokol et al. | |
| 2007/0231560 A1 | * | 10/2007 | Zhang | F28F 13/00 428/323 |
| 2008/0130221 A1 | * | 6/2008 | Varadarajan | G06F 1/203 361/679.52 |
| 2013/0027886 A1 | | 1/2013 | Crooijmans et al. | |
| 2015/0092351 A1 | * | 4/2015 | Chowdhury | H01L 23/433 165/185 |
| 2015/0301568 A1 | | 10/2015 | Hill et al. | |
| 2018/0092253 A1 | | 3/2018 | Qiu et al. | |
| 2018/0284855 A1 | * | 10/2018 | North | G06F 1/203 |
| 2018/0284856 A1 | * | 10/2018 | Shah | G06F 1/1616 |
| 2019/0157178 A1 | * | 5/2019 | Orimoto | H01L 22/34 |

(Continued)

OTHER PUBLICATIONS

International Search Report and Written Opinion—PCT/US2022/046422—ISA/EPO—dated Feb. 1, 2023.

*Primary Examiner* — Michael A Matey
(74) *Attorney, Agent, or Firm* — Loza & Loza, LLP

(57) ABSTRACT

An electronic device that includes a first device portion, a second device portion coupled to the first device portion; and a thermally conductive connector coupled to the first device portion and the second device portion, wherein the thermally conductive connector includes a graphite sheet. The first device portion includes a region that includes a component configured to generate heat.

19 Claims, 11 Drawing Sheets

BACK SIDE VIEW

(56) References Cited

U.S. PATENT DOCUMENTS

| | | | |
|---|---|---|---|
| 2020/0279989 A1* | 9/2020 | Sperry | H01L 35/32 |
| 2021/0103317 A1* | 4/2021 | Raju | G06F 1/1681 |
| 2021/0109576 A1* | 4/2021 | Kurma | G06F 1/203 |
| 2021/0373604 A1* | 12/2021 | Shin | H05K 7/20963 |
| 2022/0159881 A1* | 5/2022 | Watanabe | G06F 1/206 |

* cited by examiner

TOP FRONT VIEW

BACK SIDE VIEW

BACK SIDE VIEW

ELECTRONIC DEVICE COMPRISING A THERMALLY CONDUCTIVE CONNECTOR COMPRISING GRAPHITE

FIELD

Various features relate to an electronic device that includes a heat dissipating device, but more specifically to an electronic device that includes a thermally conductive connector.

BACKGROUND

FIG. 1 illustrates a computer device 100 that includes a primary portion 102 and a screen portion 104. The primary portion 102 is a portion of the computer device 100 that includes a keyboard, a printed circuit board (PCB) 105, an integrated device 107 and a heat spreader 109. The PCB 105, the integrated device 107 and the heat spreader 109 may be located inside of the primary portion 102. When the integrated device 107 is operating, the integrated device 107 may generate heat that is dissipated through the heat spreader 109 and the PCB 105. The heat that is generated by the integrated device 107 mostly dissipates within the primary portion 102, which can cause one or more surfaces of the primary portion 102 of the computer device 100 to be hot enough that a user of the computer device 100 would feel uncomfortable. Additionally, the configuration shown in FIG. 1 might not be powerful enough to dissipate heat to prevent the integrated device 107 from overheating.

There is an ongoing need to improve the heat dissipating capabilities of a device that includes a component that generates heat.

SUMMARY

Various features relate to an electronic device that includes a heat dissipating device, but more specifically to an electronic device that includes a thermally conductive connector.

One example provides an electronic device that includes a first device portion comprising a region that includes a component configured to generate heat; a second device portion coupled to the first device portion; and a thermally conductive connector coupled to the first device portion and the second device portion, wherein the thermally conductive connector includes a graphite sheet.

Another example provides an apparatus comprising a first device portion comprising a region that includes a component configured to generate heat; a second device portion coupled to the first device portion; and means for thermal conduction coupled to the first device portion and the second device portion, wherein the means for thermal conduction includes a graphite sheet.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an electronic device that includes a first device portion, a second device portion coupled to the first device portion, and a thermally conductive connector coupled to the first device portion and the second device portion. The first device portion comprises a region that includes a component configured to generate heat. The thermally conductive connector includes graphite. For example, the thermally conductive connector may include a graphite sheet that includes slits. The slits may define fiber portions of the graphite sheet. The fiber portions of the graphite sheet may be configured as a flexible cable for the connector. The thermally conductive connector is configured to dissipate heat away from the first device portion and towards the second device portion. The thermally conductive connector may extend through at least one cavity of at least one hinge that couples the first device portion and the second device portion. The thermally conductive connector includes a thermally conductive material that primarily dissipates heat along a first direction of the thermally conductive material. The use of the thermally conductive connector enables a more efficient heat dissipation from one region to another region without the need of having a separate insulator around the thermally conductive connector, which can reduce the overall thickness of the connector while still providing effective heat dissipation and heat distribution.

Figure 1:
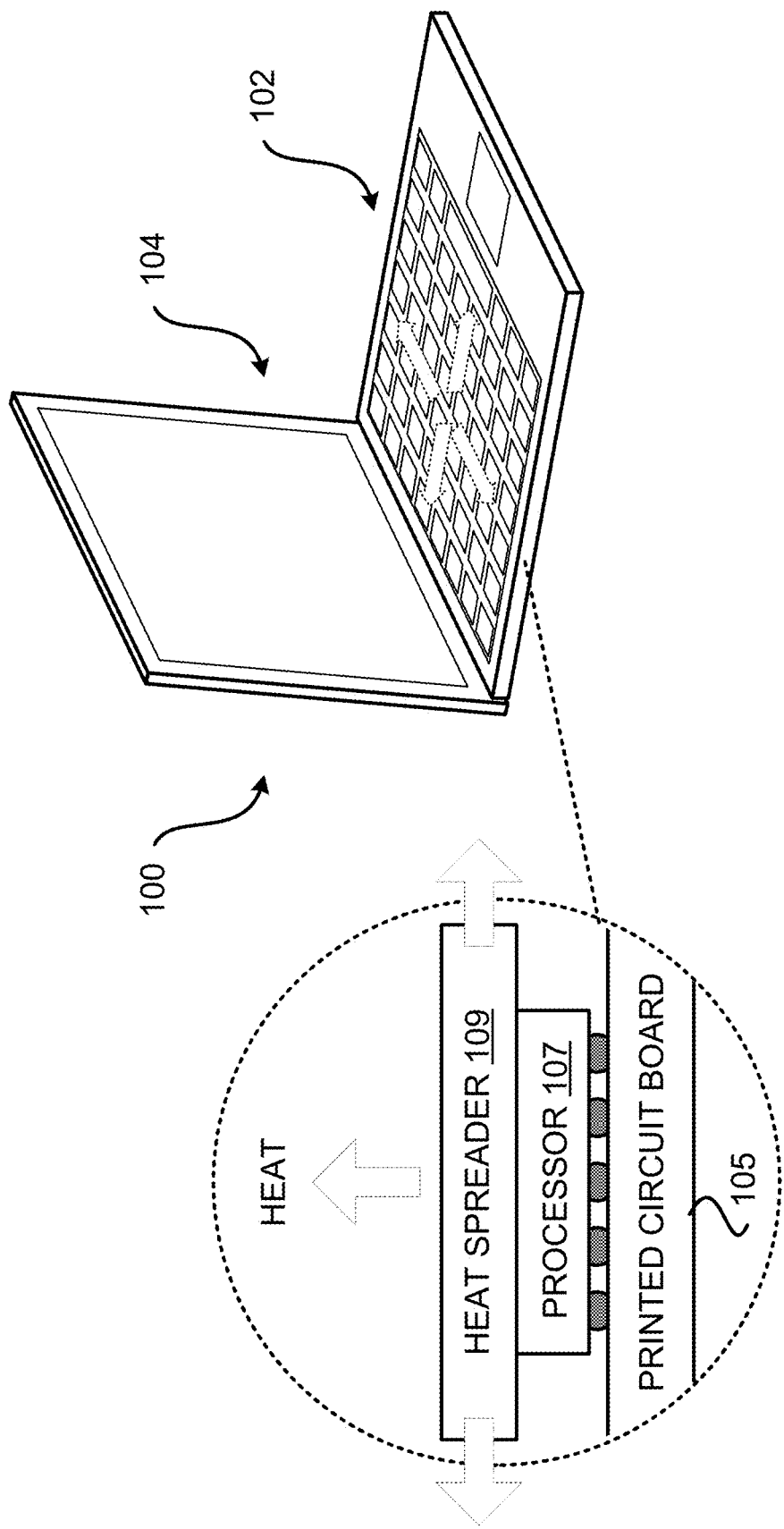
FIG. 1 illustrates a view of a computer device that includes a heat spreader.
Figure 2:
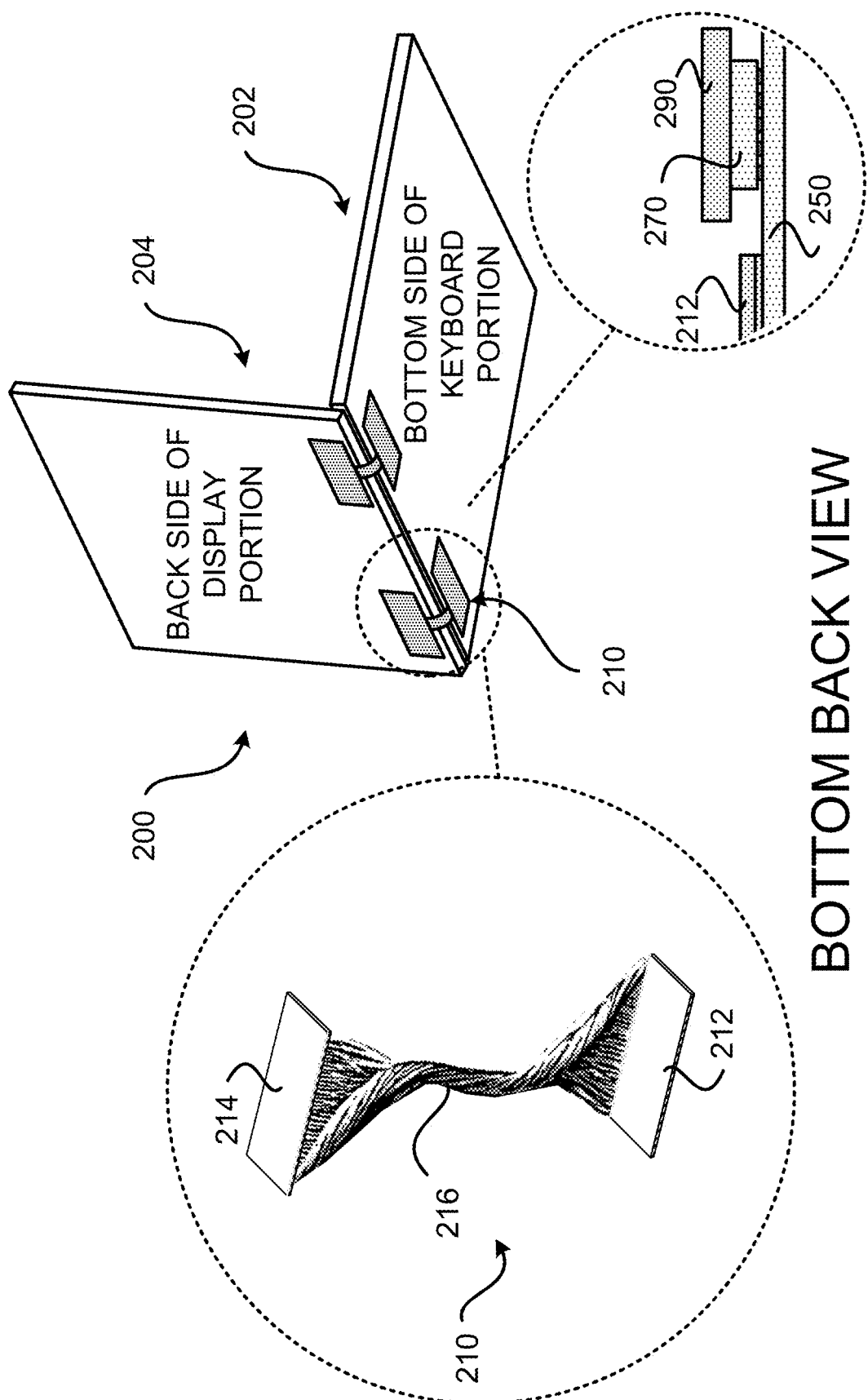
FIG. 2 illustrates a view of a computer device configured to include a thermally conductive connector comprising graphite.
Figure 3:
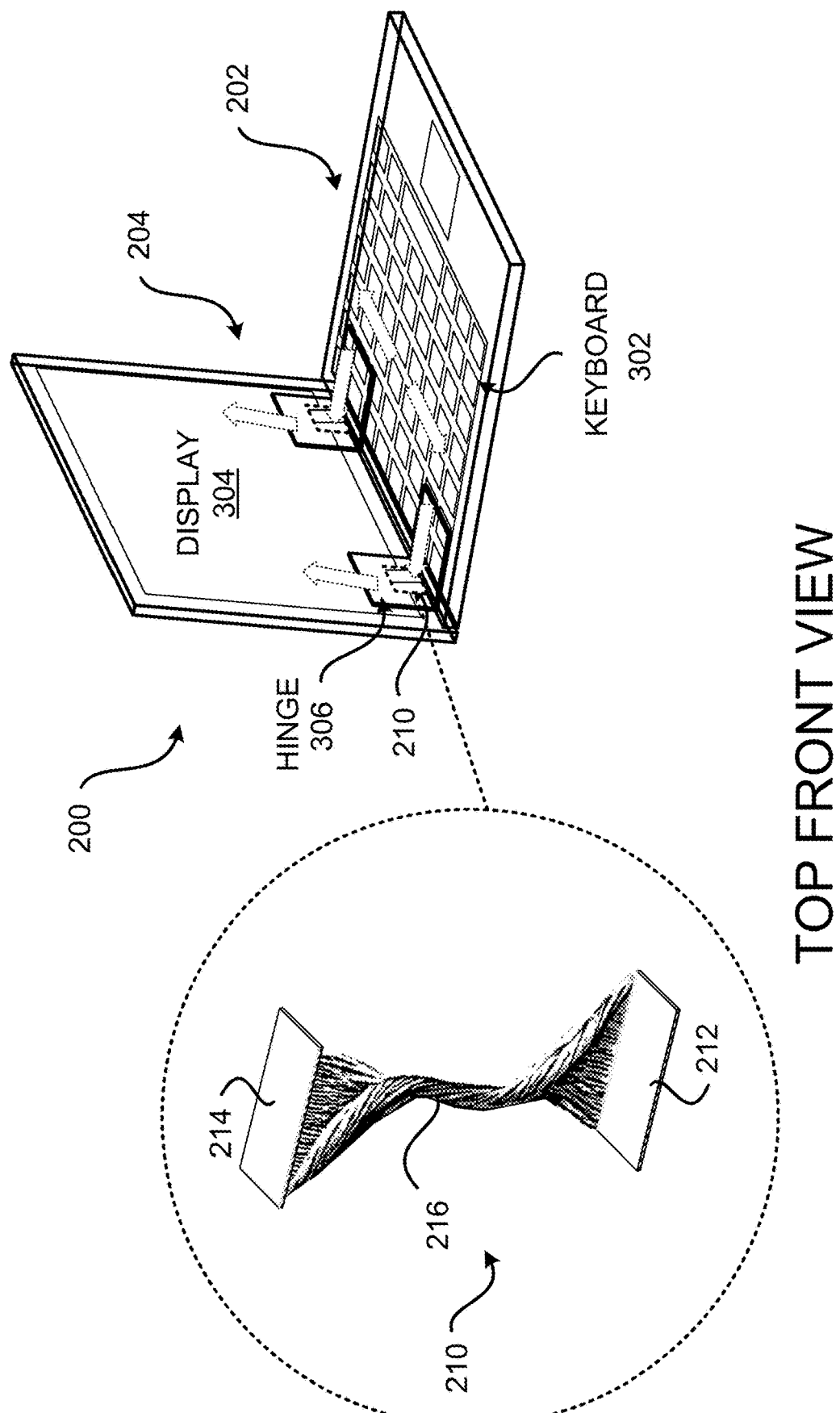
FIG. 3 illustrates a view of a computer device configured to include a thermally conductive connector comprising graphite.

Exemplary Electronic Device Comprising a Thermally Conductive Connector That Includes Graphite FIGS. 2 and 3 illustrate an electronic device 200 that includes a thermally conductive connector. FIG. 2 illustrates a bottom back view of the electronic device 200. FIG. 3 illustrates a top front view of the electronic device 200. The electronic device 200 includes a first device portion 202, a second device portion 204 and a connector 210. The connector 210 is a thermally conductive connector that includes graphite. As will be further described below, the connector 210 may include a graphite sheet with several slits, where portions of the graphite sheet is twisted to form a flexible cable. The slits in the graphite sheet help create graphite fibers (e.g., plurality of graphite fiber portions) that can be twisted and makes at least part of the graphite sheet like a cable. The thermally conductive connector 210 is coupled to the first device portion 202 and the second device portion 204. The thermally conductive connector 210 is configured to dissipate heat away from the first device portion 202 and towards the second device portion 204. The thermally conductive connector 210 may be configured to dissipate heat away from the second device portion 204 and towards the first device portion 202.

The first device portion 202 may be the main body of the electronic device 200. The first device portion 202 may include several components, including a main body cover, a main body frame, a keyboard 302, a pad, a battery, at least one integrated device (e.g., processor, memory, modem), a package (e.g., radio frequency front end package) and/or a printed circuit board. The second device portion 204 may be configured to provide a display for the electronic device 200. The second device portion 204 may include a display body cover, a display body frame and a display 304. However, it is noted that the first device portion 202 and the second device portion 204 may be configured to include different components and/or other components.

The thermally conductive connector 210 includes a first conducting portion 212, a second conducting portion 214 and a third conducting portion 216. The first conducting portion 212, the second conducting portion 214 and the third conducting portion 216 may be contiguous portions. The third conducting portion 216 may be folded, twisted, compressed and/or bent. The third conducting portion 216 may be twisted and/or braided in a rope like fashion. The third conducting portion 216 may be wrapped or surrounded by a tape and/or other similar material. The third conducting portion 216 may be configured as a flexible cable (e.g., flexible cable portion). The thermally conductive connector 210 may include a thermally conductive material with a thermal conductivity in a range of approximately 1100-1900 Watts per meter kelvin (W/(mk)). The thermally conductive connector 210 may be a means for thermal conduction (e.g., means for anisotropic thermal conduction).

The use of a graphite sheet with slits and fiber portions, provides a very cost effective design to help dissipate and move heat in a device. The graphite sheet may be made to be flexible, which helps the graphite sheet to be easily implemented in tight spaces of a device, including between different components of a device.

As mentioned above, the connector 210 is coupled to the first device portion 202 and the second device portion 204. The connector 210 may be located inside and/or outside of the first device portion 202 and the second device portion 204. The connector 210 may be coupled to one or more components of the electronic device 200. As will be further described below, the portions of the connector 210 may extend through a cavity in one or more hinges of the device 200.

As shown in FIG. 2, the electronic device 200 includes a printed circuit board (PCB) 250, an integrated device 270, and a heat spreader 290. The integrated device 270 may be coupled to the PCB 250 (e.g., through solder interconnects). The heat spreader 290 may be coupled to the integrated device 270. The integrated device 270 may include a radio frequency (RF) device, a passive device, a filter, a surface acoustic wave (SAW) filters, a bulk acoustic wave (BAW) filter, a processor, a memory, and/or combinations thereof. The integrated device 270 is an example of a component that is configured to generate heat (e.g., configured to generate heat when the integrated device is operating and/or active).

The PCB 250, the integrated device 270 and the heat spreader 290 may be located in a region of the first device portion 202 of the electronic device 200. The first conducting portion 212 of the connector 210 is coupled to the PCB 250. The first conducting portion 212 may be coupled to the PCB 250 through an adhesive. In some implementations, at least some of the heat that is generated by the integrated device 270 may travel through the PCB 250, the connector 210 (e.g., the first conducting portion 212, the third conducting portion 216, and the second conducting portion 214), and towards the second device portion 204. As will be further described below in at least FIGS. 4-6, the connector 210 may be coupled to other components of the electronic device 200.

As shown in FIG. 3, the first device portion 202 and the second device portion 204 may be coupled together through at least one hinge 306. The at least one hinge 306 is configured to allow the second device portion 204 to rotate relative to the first device portion 202. In some implementations, portions of the connector 210 may extend through the at least one hinge 306 (e.g., through cavity of the at least one hinge 306), and/or may be coupled to the at least one hinge 306. In some implementations, the connector 210 and the at least one hinge 306 may help dissipate heat away from the first device portion 202 and towards the second device portion 204. In some implementations, the connector 210 and the at least one hinge 306 may help dissipate heat away from the second device portion 204 and towards the first device portion 202. Portions of the connector 210 may extend through one or more cavities of the at least one hinge 306. Portions of the connector 210 may extend through one or more cavities of the first device portion 202, the second device portion 204 and/or at least one hinge 306.

Figure 4:
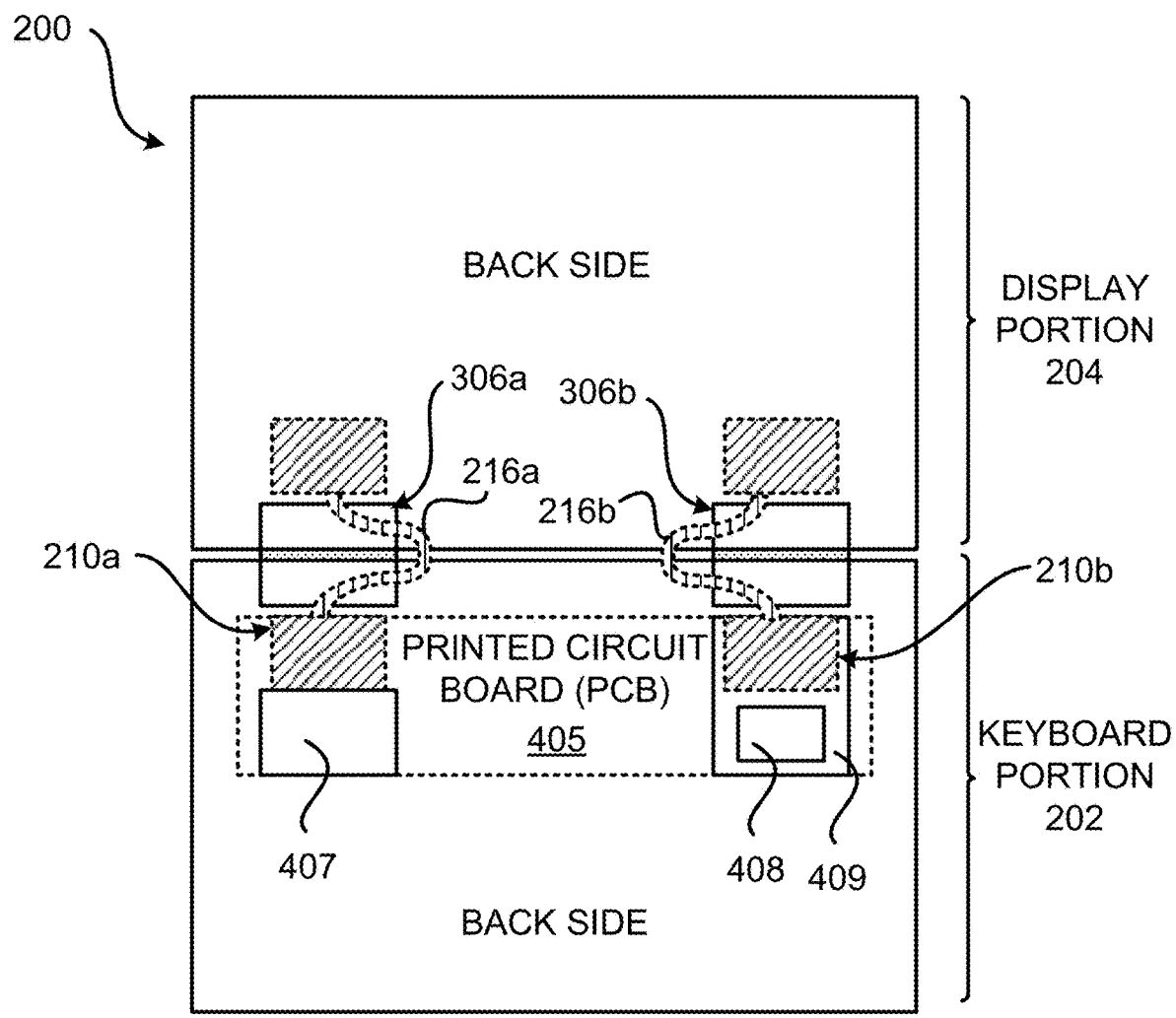
FIG. 4 illustrates a view of a computer device configured to include a thermally conductive connector comprising graphite.
Figure 5:
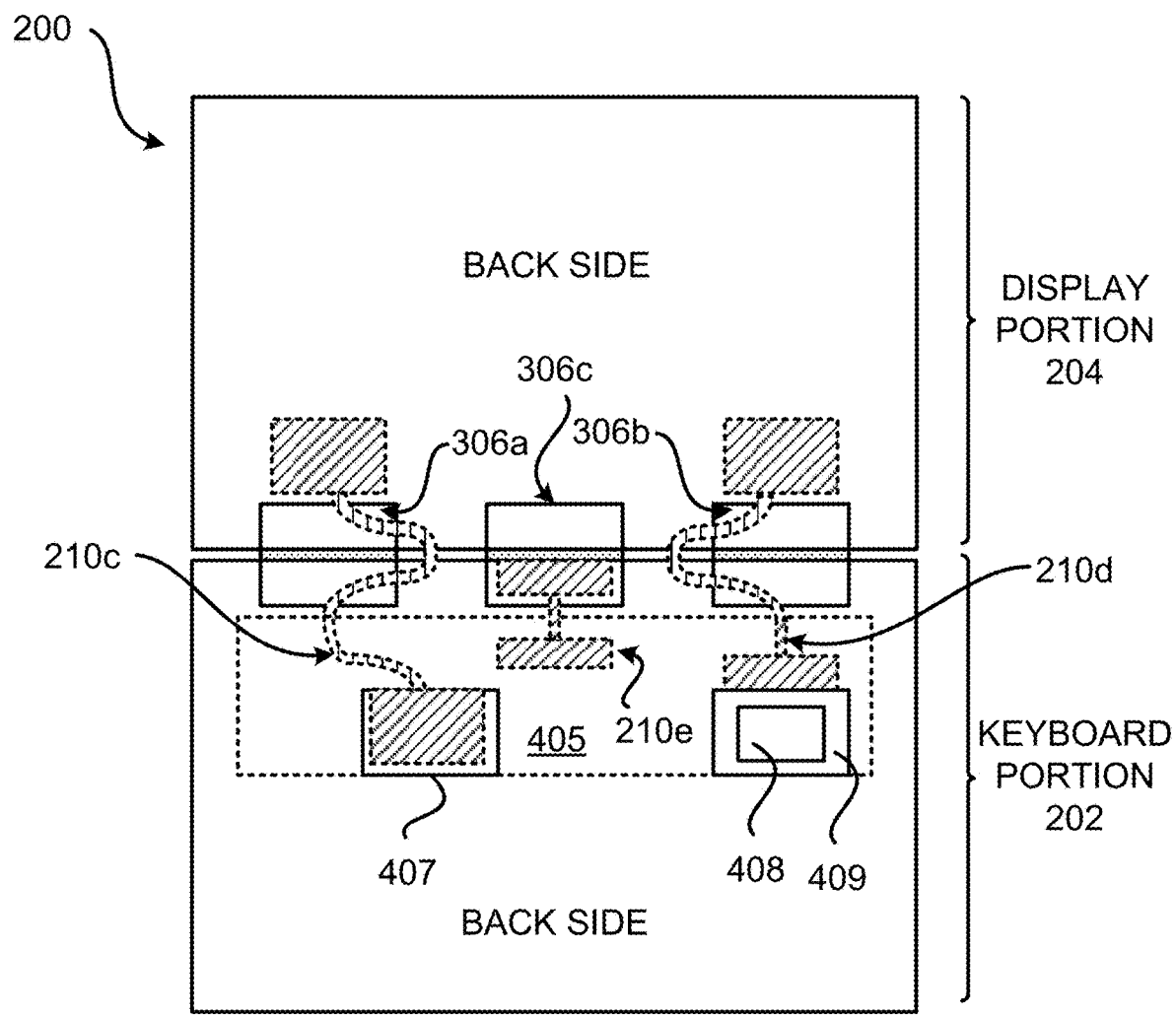
FIG. 5 illustrates a view of a computer device configured to include a thermally conductive connector comprising graphite.
Figure 6:
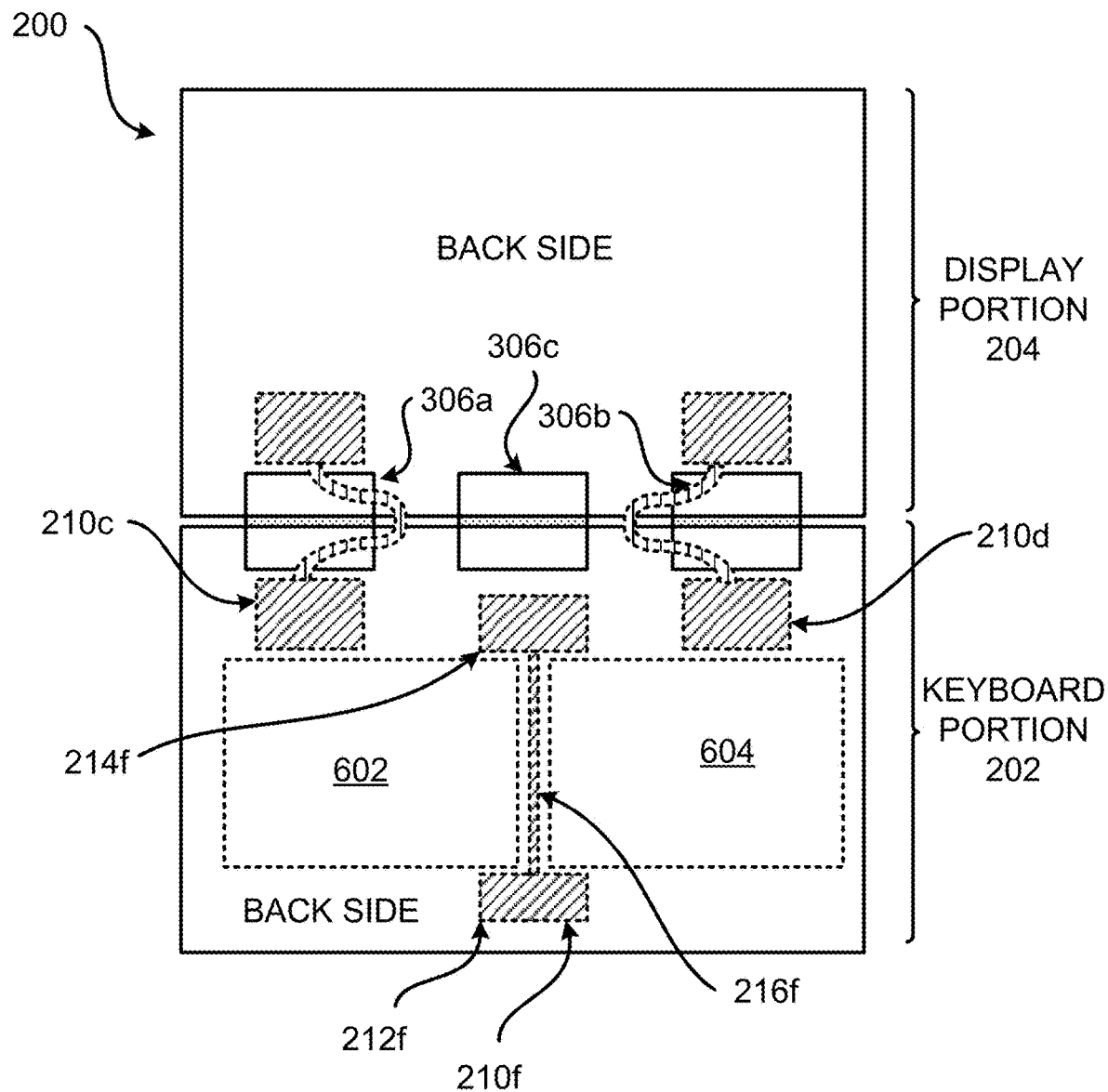
FIG. 6 illustrates a view of a computer device configured to include a thermally conductive connector comprising graphite.

As mentioned above, the thermally conductive connector 210 may be coupled to various components of the first device portion 202 and various components of the second device portion 204. FIGS. 4-6 illustrate examples of the different components that the connector 210 may be coupled to.

FIG. 4 illustrates the electronic device 200 that includes the first device portion 202, the second device portion 204, the hinge 306a and the hinge 306b. The first device portion 202 is coupled to the second device portion 204 through the hinges 306a-306b. The electronic device 200 also includes the thermally conductive connector 210a, a thermally conductive connector 210b, a PCB 405, an integrated device 407, an integrated device 408, a heat spreader 409, and a display (not visible). The PCB 405, the integrated device 407, the integrated device 408 and the heat spreader 409 are located in the first device portion 202 The display may be located in the second device portion 204 of the electronic device 200.

The connector 210a and the connector 210b are each coupled to the first device portion 202 and the second device portion 204. The connector 210a may extend through the hinge 306a. For example, the third conducting portion 216a may extend through a cavity in the hinge 306a. The connector 210b may extend through the hinge 306b. For example, the third conducting portion 216b may extend through a cavity in the hinge 306b. FIG. 4 illustrates that the connector 210a is coupled to the PCB 405 and a first portion (e.g., component) of the second device portion 204. In some implementations, at least some heat that is generated by the integrated device 407 may extend through the PCB 405, through the connector 210 and to the second device portion 204. The connector 210b is coupled to the heat spreader 409 and a second portion (e.g., component) of the second device portion 204. In some implementations, at least some heat that is generated by the integrated device 408 may extend through the heat spreader 409, the connector 210b and to the second device portion 204.

FIG. 5 illustrates the electronic device 200 that includes a plurality of hinges (306a, 306b, and 306c) and a plurality of thermally conductive connectors 210c, 210d and 210e. The first device portion 202 is coupled to the second device portion 204 through the plurality of hinges (306a, 306b, and 306c). The connector 210c and the connector 210d are each coupled to the first device portion 202 and the second device portion 204. The connector 210c may extend through the hinge 306a. The connector 210d may extend through the hinge 306b. The connector 210e may be coupled to different device portions of the first device portion 202. For example, the connector 210e may be coupled to the PCB 405 and the hinge 306c of the first device portion 202.

FIG. 5 illustrates that the connector 210c is coupled to the integrated device 407 and a first portion (e.g., component) of the second device portion 204. In some implementations, at least some heat that is generated by the integrated device 407 may extend through the connector 210 and to the second device portion 204. The connector 210d is coupled to the PCB 405 and a second portion (e.g., component) of the second device portion 204. In some implementations, at least some heat that is generated by the integrated device 408 may extend through the heat spreader 409, and at least some of the heat that is generated by the integrated device 408 may extend through PCB 405, the connector 210d and to the second device portion 204. The connector 210e is coupled to the PCB 405 and the hinge 306c. In some implementations, at least some of the heat that is generated by the integrated device 407 may extend through the PCB 405, through the connector 210e, through the hinge 306c, and to the second device portion 204. Similarly, in some implementations, at least some of the heat that is generated by the integrated device 408 may extend through the PCB 405, through the connector 210e, through the hinge 306c, and to the second device portion 204.

FIG. 6 illustrates the electronic device 200 that includes a plurality of hinges (306a, 306b, and 306c) and a plurality of thermally conductive connectors 210c, 210d and 210f. The first device portion 202 is coupled to the second device portion 204 through the plurality of hinges (306a, 306b, and 306c). The connector 210c and the connector 210d are each coupled to the first device portion 202 and the second device portion 204. The connector 210c may extend through the hinge 306a. The connector 210d may extend through the hinge 306b. The device 200 may include one or more batteries. FIG. 6 illustrates that the device 200 includes at least two batteries (e.g., 602, 604). The connector 210f is coupled to the first device portion 202. The connector 210f includes a first conducting portion 212f, a third conducting portion 216f, and a second conducting portion 214f. The first conducting portion 212f is coupled to a device portion (e.g., first device portion) from the device portion 202, and the second conducting portion 214f is coupled to another device portion (e.g., second device portion) from the device portion 202. The connector 210f may extend between the battery 602 and the battery 604. The connector 210f may be coupled to any two components, two portions and/or two regions of the first device portion 202. The connector 210f may be configured to allow heat to travel between the battery 602 and the battery 604 without heat being substantially dissipated to the battery 602 and/or the battery 604 from the third conducting portion 216f of the connector 210f. This may be the case because, the connector 210f includes material (e.g., graphite, graphite sheet) that is configured to conduct heat primarily along one direction (e.g., along the length of the connector 210f). Such material that conducts heat primarily (e.g., at least 90%) in one direction may be an anisotropic thermally conductive material. The connector 210f may be a means for thermal conduction (e.g., means for anisotropic thermal conduction). In some implementations, the connector 210f may be configured to extend through the hinge 306c, such that the third conducting portion 216f extends through the hinge 306c (e.g., through a cavity of the hinge 306c) and the second conducting portion 214f is coupled to the second device portion 204.

The connectors (e.g., 210, 210a, 210b, 210c, 210d, 210e, 210f) may be coupled to a region that includes one or more components. The connectors (e.g., 210, 210a, 210b, 210c, 210d, 210e, 210f) may be directly coupled to one or more components, or may be coupled to one or more components through an adhesive. The adhesive may be a double-sided adhesive. The adhesive may include a thermally conductive adhesive. The adhesive may have a thermal conductivity value of approximately 2 W/(mk) or higher. However, the adhesive may have a thermal conductivity value that is lower than 2 W/(mk).

It is noted that the implementation of the connectors is not limited to electronic devices that include a display and a keyboard. The connectors may be implemented in any devices that include at least two regions and/or at least two portions. For example, the connectors may be implemented in a mobile device that includes a foldable or bendable display, where the bendable display is located in two portions of the mobile device. The use of at least one thermally conductive connector (e.g., 210) may reduce and minimize the amount of heat that is dissipated into the first device portion 202. Thus, more heat is distributed and dissipated into the second device portion 204. This has the effect of increasing the temperature of the second device portion 204. However, since more heat is being dissipated in the second device portion 204, the temperature of the first device portion 202 does not increase as much, thus ensuring a more comfortable experience for a user of the electronic device 200 because the first device portion 202 (which includes a keyboard) is a portion of the electronic device that a user is more likely to use and touch. Examples of heat distribution maps and temperature performances for an electronic device are further illustrated and described in FIGS. 7-10.

FIGS. 2-6 illustrate that at least one of the connectors 210 includes a conducting portion (e.g., third conducting portion 216c) that may be optionally twisted and/or braided in a rope like fashion. It is noted that any of the connectors (e.g., 210a, 210b, 210d, 210e, 210f) described in the disclosure may include a conducting portion (e.g., 216) that is twisted and/or braided in a rope like fashion. The twisting helps provide a flexible cable (e.g., flexible cable portion) for the connector 210. Different implementations may twist or braid a conducting portion in different manners. Twisting and/or braiding a conducting portion may make a connector more compact, stronger and more resilient.

The connector 210 may be coupled to adhesives (not shown). The adhesives may be a double-sided tape. The adhesives may help the connector 210 couple to different components of an electronic devices.

As mentioned above, the connector 210 may include a thermally conductive material that includes graphite (e.g., graphite sheet). Graphite is an example of a material that includes an anisotropic thermal conductivity value. The graphite sheet may have a thermal conductivity value in a X-Y plane (X-axis/direction, Y axis/direction) in a range of approximately 1100-1900 W/(mk), and a thermal conductivity value in a Z axis/direction in a range of approximately 15-21 W/(m/k).

Figure 8:
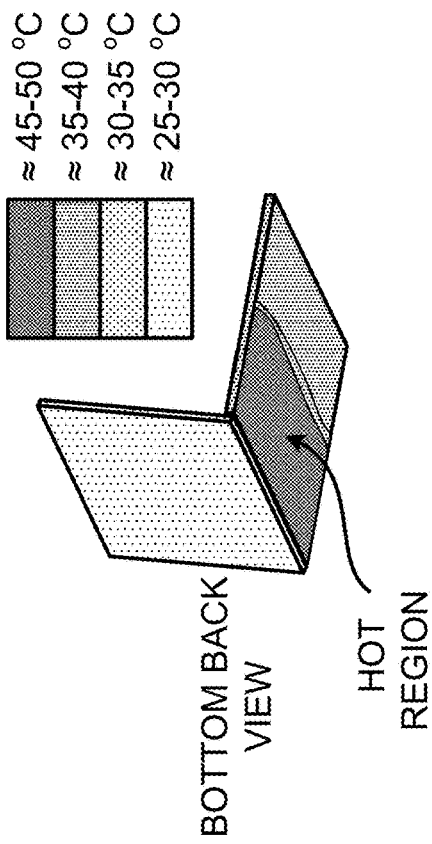
FIG. 8 illustrates an exemplary heat map for a computer device that includes a thermally conductive connector.
Figure 7:
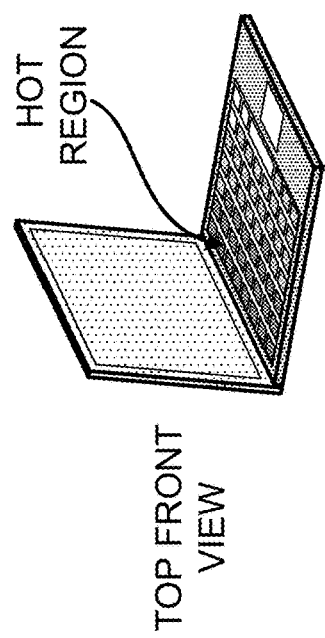
FIG. 7 illustrates an exemplary heat map for a computer device without a heat dissipating cable.

FIGS. 7 and 8 illustrate heat maps for an electronic device without a thermally conducive connector and an electronic device with a thermally conductive connector. As shown in FIG. 7, the electronic device without a thermally conductive connector reaches high temperatures (e.g., hot region) in several parts of the keyboard portion and the back side of the keyboard portion. The keyboard portion is a region that the user touches during an operation of the electronic device, and the back side of the keyboard portion may be a portion that is resting on top of a user (e.g., legs of user). FIG. 7 illustrates that the region the electronic device is hottest is also the region a user is most likely to touch.

FIG. 8 illustrates that the electronic device with a thermally conductive connector results in lower temperatures in the keyboard portion, since more heat has been dissipated into the display portion of the electronic device. Although the display portion is hotter, the user of the electronic device is not likely to touch it as much as the keyboard portion. FIG. 8 illustrates that an electronic device with a thermally conductive connector provides an electronic device that is more comfortable (temperature wise) than an electronic device without the thermally conductive connector.

Figure 10:
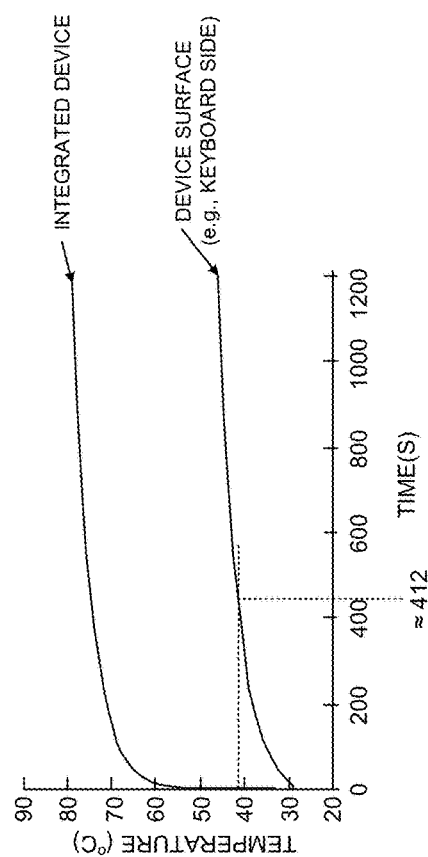
FIG. 10 illustrates an exemplary temperature profile for a computer device that includes a thermally conductive connector.
Figure 9:
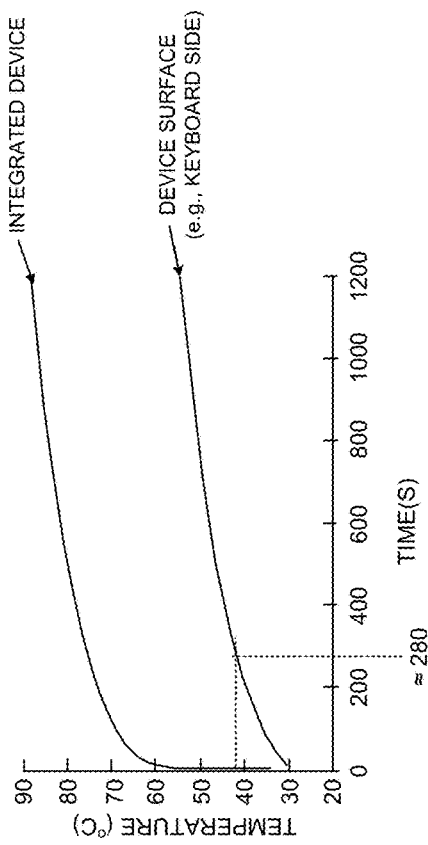
FIG. 9 illustrates an exemplary temperature profile for a computer device without a heat dissipating cable.

FIGS. 9 and 10 illustrate graphs that show heat dissipating and temperature performances of a device that does not use a thermally conducive connector and a device that uses a thermally conductive connector. The graph 900 illustrates a temperature profile (e.g., junction temperature profile) of an integrated device and a top surface temperature profile (e.g., a keyboard surface temperature profile) of the device, when no thermally conductive connector is implemented with a device. The graph 1000 illustrates a temperature profile (e.g., junction temperature profile) of an integrated device (e.g., integrated device 270, 407, 408) and top surface temperature profile (e.g., a keyboard surface temperature profile) of the device, when a thermally conductive connector (e.g., 210) is implemented with the device (e.g., 200).

The graph 900 illustrates that within about 500 seconds, the junction temperature of the integrated device has risen to about 80 degrees Celsius. In contrast, as shown in graph 1000, when a thermally conductive connector is implemented, the junction temperature of the integrated device has risen to less than 75 degrees Celsius. The graph 900 illustrates that within about 280 seconds, the top surface temperature (e.g., keyboard surface temperature) has reached 42 Celsius (which is the normal skin temperature of a human) In contrast, as shown in graph 1000, when a thermally conductive connector is implemented, the top surface temperature (e.g., keyboard surface temperature) does not reach 42 degrees Celsius until at least about 410 seconds. With the thermally conductive connector, the integrated device may not need to be throttled until 410 seconds. At around 1200 seconds, the temperature of the integrated device in a device without the thermally conductive connector, reaches about 88 degrees Celsius. In contrast, at around 1200 seconds, the temperature of the integrated device that includes a thermally conductive connector, reaches about 79 degrees Celsius, a 9-degree Celsius improvement. In addition, the integrated device may be able to operate at "full speed" for a longer period of time, before throttling of the integrated device is necessary. For example, if the integrated device is configured to perform signal processing (e.g., signal processing at 5G speeds), the integrated device may operate for longer periods of time (e.g., may process signals at 5G speeds for longer periods of time, which means more data transfer (throughput) capabilities), before having to throttle the speed down, when a thermally conductive connector is implemented in an electronic device.

FIG. 10 illustrates that the use of a thermally conductive connector (e.g., 210 provides better heat dissipation of integrated devices (e.g., 202), while also reducing the rate at which the surface temperatures of a devices increases, thereby making the device more comfortable for a user of the device.

It is noted that the illustrations of FIGS. 7-10 are merely exemplary. Different implementations may provide different results and performances in the heat map and temperature profiles.

Figure 11:
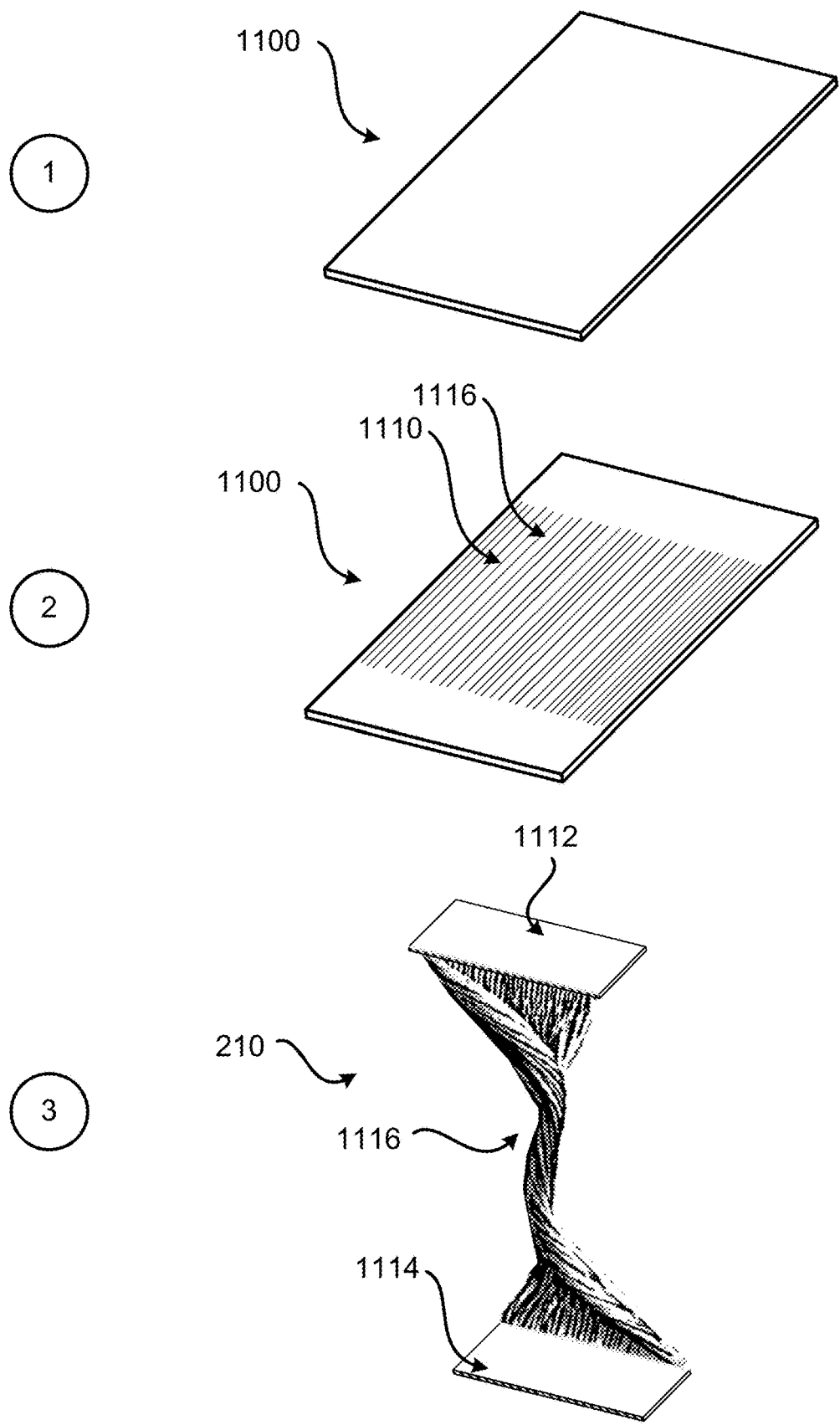
FIG. 11 illustrates an exemplary sequence for fabricating a thermally conductive connector that includes graphite.

Exemplary Sequence for Fabricating a Thermally Conductive Connector Comprising Graphite FIG. 11 illustrates an exemplary sequence for providing or fabricating a thermally conductive connector. In some implementations, the sequence of FIG. 11 may be used to provide or fabricate the thermally conductive connector (e.g., 210, 210a, 210b, 210c, 210d, 210e, 210f) described in the disclosure.

It should be noted that the sequence of FIG. 11 may combine one or more stages in order to simplify and/or clarify the sequence for providing or fabricating a connector. In some implementations, the order of the processes may be changed or modified. In some implementations, one or more of processes may be replaced or substituted without departing from the spirit of the disclosure.

Stage 1, as shown in FIG. 11, illustrates a state after a thermally conductive material 1100 is provided. The thermally conductive material 1100 may include graphite. For example, the thermally conductive material 1100 may include a graphite sheet. The thermally conductive material 1100 may be configured to conduct heat primarily along one direction. The material 1100 may be a thermally conductive material that has a high thermal conductivity value in the first direction (e.g., axial direction, along length), and a low thermal conductivity value in at least a second direction (e.g., radially, along width, along height). The graphite sheet may have a thermal conductivity value in a X-Y plane (X-axis/direction, Y axis/direction, width/length, length/width) in a range of approximately 1100-1900 W/(mk), and a thermal conductivity value in a Z axis/direction (e.g., sheet thickness) in a range of approximately 15-21 W/(m/k).

Stage 2 illustrates a state after a plurality of slits 1110 is formed in the thermally conductive material 1100. The slits 1110 may be cut into the thermally conductive material 1100. For example, the slits 1110 may be cut into the graphite sheet. Forming the slits 1110 creates fiber portions (e.g., plurality of fiber portions, plurality of graphite fibers portions) that can be twisted and/or braided. The fiber portions may form a third conducting portion 1116. The slits 1110 may be formed using a scissor and/or a knife. The slits 1110 may be along the length of the thermally conductive material 1100. In some implementations, the slits 1110 may be formed diagonally along the thermally conductive material 1100. The slits 1110 may have varying lengths. The spacing between neighboring slits may be constant or variable.

Stage 3 illustrates a state after the third conducting portions 1116 of the material 1100 are twisted and/or braided, forming the third conducting portion 1116 that includes fiber portions that are twisted and/or braided. The third conducting portion 1116 may correspond to the third conducting portion 216. The third conducting portion 1116 may be configured as a flexible cable (e.g., flexible cable portion). The third conducting portion 1116 is coupled to the first conducting portion 1112 and the second conducting portion 1114 of the thermally conductive material 1100. The first conducting portion 1112, the third conducting portion 1116 and the second conducting portion 1114 may be a contiguous portion. The first conducting portion 1112 may be similar to the first conducting portion 212. The second conducting portion 1114 may be similar to the second conducting portion 214. Stage 3 may illustrate the connector 210 that includes the first conducting portion 1112, the second conducting portion 1114 and the third conducting portion 1116. The thermally conductive material may have a thermal conductivity value in a first direction (e.g., axial direction, along the length of the third conducting portion 1116) that is in a range of approximately 1100-1900 Watts per meter kelvin (W/(mk)). For example, the third conducting portion 1116 may have a thermal conductivity value in a first direction (e.g., axial direction, along length of third conducting portion, along length of fiber portions of third conducting portion) that is in a range of approximately 1100-1900 Watts per meter kelvin (W/(mk)).

In some implementations, a tape (not shown) and/or other material may be used to surround and/or wrap portions (e.g., third conducting portion 1116) of the material 1100. However, different implementations may use different materials to surround and/or wrap the third conducting portion (e.g., 216, 1116). In some implementations, other material may be coupled to the connector 210. For example, an adhesive (not shown) may be coupled to the first conducting portion 1112. A base (not shown) may be coupled to the adhesive. The base may include a hard plastic and/or a metal. An adhesive may be coupled to the base. An adhesive (not shown) may be coupled to the second conducting portion 1114. A base (not shown) may be coupled to the adhesive. The base may include a hard plastic and/or a metal. An adhesive (not shown) may be coupled to the base. The above components may be considered part of the connector 210. In some implementations, the connector 210 may be coupled to components of an electronic devices through the adhesives.

Figure 12:
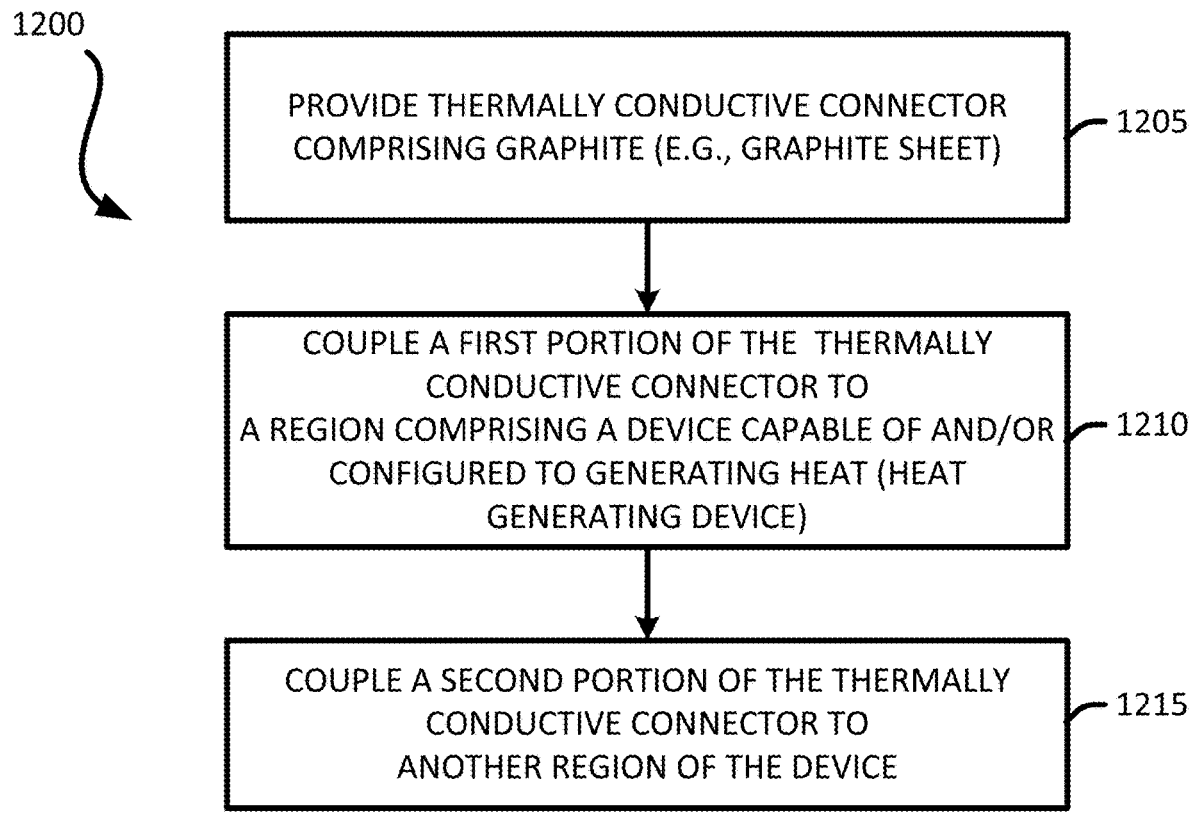
FIG. 12 illustrates an exemplary flow diagram of a method for providing a computer device with thermally conductive connector that includes graphite.

Exemplary Flow Diagram of a Method for Coupling a Thermally Conductive Connector to an Electronic Device FIG. 12 illustrates an exemplary flow diagram of a method 1200 for coupling a thermally conductive connector to an electronic device. In some implementations, the method 1200 of FIG. 12 may be used to couple the connector 210 to an electronic device 200. However, the method 1200 may be used to couple a connector to any device described in the disclosure.

It should be noted that the sequence of FIG. 12 may combine one or more processes in order to simplify and/or clarify the method for coupling a connector to any device. In some implementations, the order of the processes may be changed or modified.

The method provides (at 1205) a thermally conductive connector (e.g., 210). FIG. 11 illustrates and describes an example of fabricating a thermally conductive connector. The thermally conductive connector may include a thermally conductive material (e.g., 1100) that may be configured to conduct heat primarily along one or more directions. The material 1100 may be a composite material. The material 1100 includes a plurality of carbon fibers that are aligned and/or oriented in a particular direction. The material 1100 may include pitch-based carbon fiber. The material 1100 may be a thermally conductive material that has a high thermal conductivity value in the first direction (e.g., axial direction, along length), and a low thermal conductivity value in at least a second direction (e.g., radially, along width, along height). The thermally conductive material 1100 may have a thermal conductivity value in a first direction (e.g., axial direction) that is in a range of approximately 1100-1900 Watts per meter kelvin (W/(mk)). The connector may include a first conducting portion (e.g., 212), a second conducting portion (e.g., 214) and a third conducting portion (e.g., 216).

The method couples (at 1210) a first conducting portion (e.g., 212) of the thermally conductive connector, to a region that includes at least one component configured to generate heat (e.g., heat generating component). For example, the method may couple the first conducting portion to a region or portion of the first device portion (e.g., 202) of the electronic device 200. A component may include an integrated device, a radio frequency (RF) device, a passive device, a filter, a surface acoustic wave (SAW) filters, a bulk acoustic wave (BAW) filter, a processor, a memory, and/or combinations thereof. An adhesive may be used to couple the first conducting portion to a region and/or a component. The first conducting portion may be coupled to a component of the first device portion 202 of the electronic device 200. FIGS. 4-6 illustrate examples of where the first conducting portion may be coupled.

The method couples (at 1215) a second conducting portion (e.g., 214) of the thermally conductive connector, to another region of the electronic device. For example, the method may couple the second conducting portion to a region of the second device portion (e.g., 204) of the electronic device 200. In another example, the method may couple the second conducting portion to another region or another portion of the first device portion (e.g., 202) of the electronic device 200. An adhesive may be used to couple the second conducting portion to a region and/or a component. The second conducting portion may be coupled to a component of the first device portion 202 or the second device portion 204. FIGS. 4 and 5 illustrate examples of where the second conducting portion may be coupled. It is noted that the method may be repeated several times to couple several connectors to an electronic device.

Exemplary Electronic Devices

Figure 13:
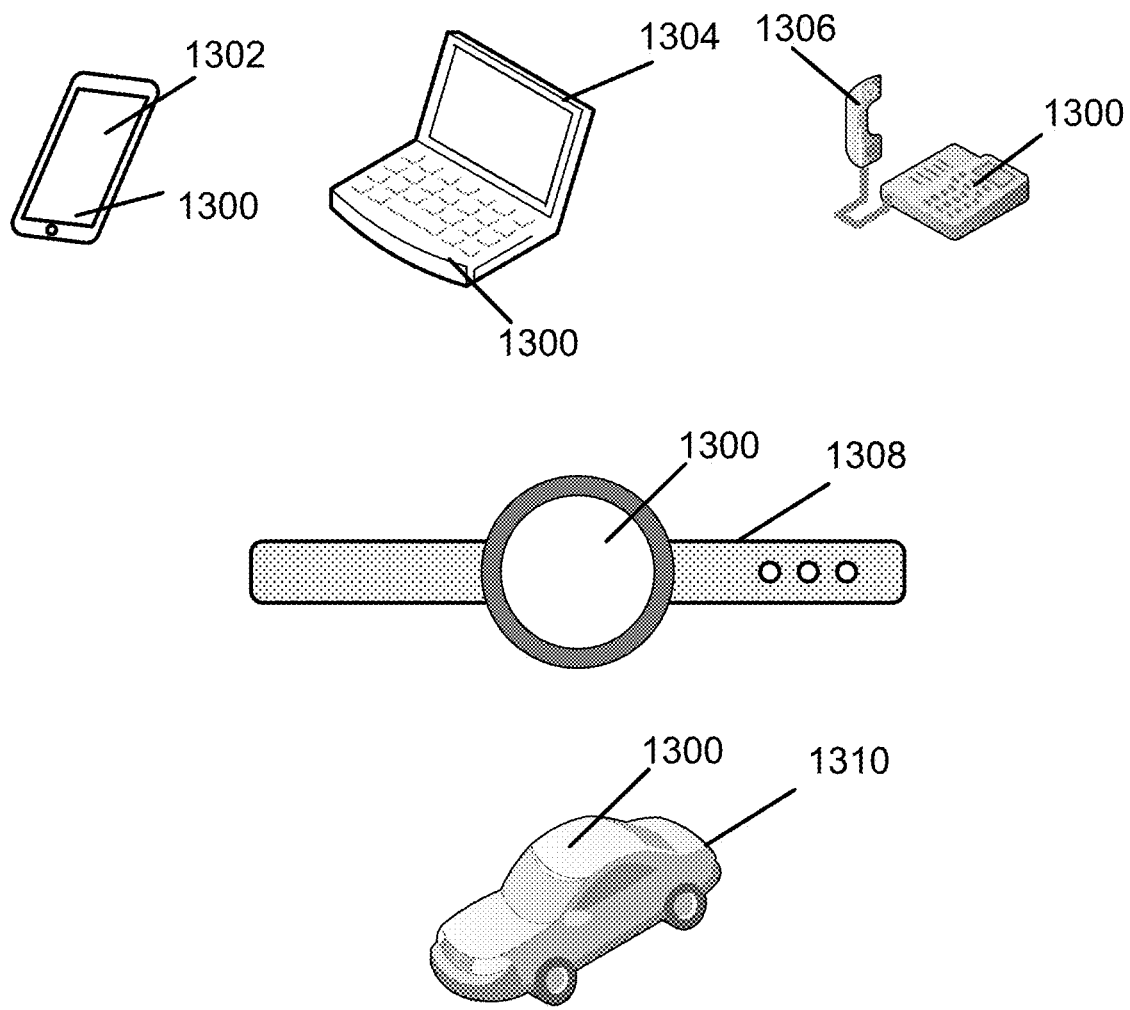
FIG. 13 illustrates various electronic devices that may integrate a die, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6 and/or 11-13 may be rearranged and/or combined into a single component, process, feature or function or embodied in several components, processes, or functions. Additional elements, components, processes, and/or functions may also be added without departing from the disclosure. It should also be noted FIGS. 2-6 and/or 11-13 and its corresponding description in the present disclosure is not limited to dies and/or ICs. In some implementations, FIGS. 2-6 and/or 11-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. Electromagnetic coupling may mean that a signal from one circuit and/or component affects a signal of another circuit and/or component. Electromagnetic coupling may cause crosstalk. Electromagnetic coupling may be a form of signal coupling. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "encapsulating" means that the object may partially encapsulate or completely encapsulate another object. The term "surrounding" means that an object(s) may partially surround or completely surround another object. The term "extends through" means that the object may partially extend or completely extend through another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect may include an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: An electronic device comprising a first device portion comprising a region that includes a component configured to generate heat; a second device portion coupled to the first device portion; and a thermally conductive connector coupled to the first device portion and the second device portion, wherein the thermally conductive connector includes a graphite sheet.

Aspect 2: The electronic device of aspect 1, wherein the graphite sheet comprises a plurality of slits; and a plurality of fiber portions that are defined by the plurality of slits.

Aspect 3: The electronic device of aspects 1 through 2, wherein the thermally conductive connector extends through a cavity of a hinge that couples the first device portion and the second device portion.

Aspect 4: The electronic device of aspects 1 through 3, wherein the thermally conductive connector includes a thermally conductive material that primarily dissipates heat along a first direction of the thermally conductive material.

Aspect 5: The electronic device of aspects 1 through 4, wherein the thermally conductive material includes an anisotropic thermally conductive material, wherein the thermally conductive material has a high thermal conductivity value in the first direction, and wherein the thermally conductive material has a low thermal conductivity value in at least a second direction.

Aspect 6: The electronic device of aspects 1 through 5, wherein the thermally conductive material includes a thermal conductivity value in the first direction that is in a range of approximately 1100-1900 Watts per meter kelvin (W/(mk)).

Aspect 7: The electronic device of aspects 1 through 6, wherein the thermally conductive connector is configured to dissipate heat away from the first device portion and towards the second device portion.

Aspect 8: The electronic device of aspects 1 through 7, wherein the thermally conductive connector is coupled to the region comprising the component configured to generate heat.

Aspect 9: The electronic device of aspects 1 through 8, wherein the thermally conductive connector includes a flexible cable portion.

Aspect 10: The electronic device of aspects 1 through 9, wherein the first device portion and the second device portion are physically separate portions.

Aspect 11: The electronic device of aspects 1 through 10, wherein the first device portion and the second device portion are coupled together through at least one hinge.

Aspect 12: The electronic device of aspects 1 through 9, wherein the first device portion and the second device portion are contiguous portions of the electronic device.

Aspect 13: The electronic device of aspects 1 through 12, wherein the thermally conductive connector is coupled to a printed circuit board (PCB).

Aspect 14: An apparatus comprising a first device portion comprising a region that includes a component configured to generate heat; a second device portion coupled to the first device portion; and means for thermal conduction coupled to the first device portion, wherein the means for thermal conduction includes a graphite sheet.

Aspect 15: The apparatus of aspect 14, wherein the graphite sheet comprises a plurality of slits; and a plurality of fiber portions that are defined by the plurality of slits.

Aspect 16: The apparatus of aspects 14 through 15, wherein the means for thermal conduction includes a thermal conductivity value in a first direction that is in a range of approximately 1100-1900 Watts per meter kelvin (W/(mk)).

Aspect 17: The apparatus of aspects 14 through 16, wherein the means for thermal conduction is coupled to the second device portion, and wherein the means for thermal conduction extends through a cavity of a hinge that couples the first device portion and the second device portion.

Aspect 18: The apparatus of aspects 14 through 17, further comprising a first battery and a second battery, wherein the means for thermal conduction extends between the first battery and the second battery.

Aspect 19: The apparatus of aspects 14 through 18, wherein the graphite sheet is twisted.

Aspect 20: The apparatus of aspects 14 through 19, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An electronic device comprising:
a first device portion comprising a region that includes a component configured to generate heat;
a second device portion coupled to the first device portion;
a first thermally conductive connector coupled to the first device portion and the second device portion, wherein the first thermally conductive connector includes a first graphite sheet;
a second thermally conductive connector including a second graphite sheet, located on the first device portion; and
a first battery and a second battery, wherein the second thermally conductive connector extends between the first battery and the second battery.

2. The electronic device of claim 1, wherein each one of the first and second graphite sheets comprises:
- a plurality of slits; and
- a plurality of fiber portions that are defined by the plurality of slits.

3. The electronic device of claim 2, wherein the fiber portions of the first thermally conductive connector at least partially extend through a cavity of a hinge that couples the first device portion and the second device portion.

4. The electronic device of claim 2,
- wherein the fiber portions of the first thermally conductive connector are a thermally conductive material that primarily dissipates heat along a first direction of the thermally conductive material;
- wherein the fiber portions of the second thermally conductive connector are a thermally conductive material that primarily dissipates heat along another direction of the thermally conductive material.

5. The electronic device of claim 4,
- wherein the thermally conductive material of the first thermally conductive connector includes an anisotropic thermally conductive material,
- wherein the thermally conductive material of the first thermally conductive connector has a high thermal conductivity value in the first direction, and
- wherein the thermally conductive material of the first thermally conductive connector has a low thermal conductivity value in at least a second direction.

6. The electronic device of claim 4, wherein the thermally conductive material of the first thermally conductive connector includes a thermal conductivity value in the first direction that is in a range of approximately 1100-1900 Watts per meter kelvin (W/(mk)).

7. The electronic device of claim 1, wherein the first thermally conductive connector is configured to dissipate heat away from the first device portion and towards the second device portion.

8. The electronic device of claim 1, wherein the first thermally conductive connector is coupled to the region comprising the component configured to generate heat.

9. The electronic device of claim 1, wherein the first thermally conductive connector includes a flexible cable portion, and the second thermally conductive connector includes a flexible cable portion.

10. The electronic device of claim 1, wherein the first device portion and the second device portion are physically separate portions.

11. The electronic device of claim 10, wherein the first device portion and the second device portion are coupled together through at least one hinge.

12. The electronic device of claim 1, wherein the first device portion and the second device portion are contiguous portions of the electronic device.

13. The electronic device of claim 1, wherein the first thermally conductive connector is coupled to a printed circuit board (PCB).

14. An apparatus comprising:
- a first device portion comprising a region that includes a component configured to generate heat;
- a second device portion coupled to the first device portion;
- first means for thermal conduction coupled to the first device portion, wherein the first means for thermal conduction includes a first graphite sheet; and
- second means for thermal conduction including a second graphite sheet, located on the first device portion; and
- a first battery and a second battery, wherein the second means for thermal conduction extends between the first battery and the second battery.

15. The apparatus of claim 14, wherein each one of the first graphite sheet and second graphite sheet comprises:
- a plurality of slits; and
- a plurality of fiber portions that are defined by the plurality of slits.

16. The apparatus of claim 14, wherein the first means for thermal conduction includes a thermal conductivity value in a first direction that is in a range of approximately 1100-1900 Watts per meter kelvin (W/(mk)).

17. The apparatus of claim 14,
- wherein the first means for thermal conduction is coupled to the second device portion, and
- wherein the first means for thermal conduction extends through a cavity of a hinge that couples the first device portion and the second device portion.

18. The apparatus of claim 14, wherein the first graphite sheet is twisted and the second graphite sheet is twisted.

19. The apparatus of claim 14, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *